Nov. 15, 1966 J. E. RACY 3,286,198
FREQUENCY STABILIZED TRANSISTOR CRYSTAL OSCILLATOR
Filed March 20, 1964
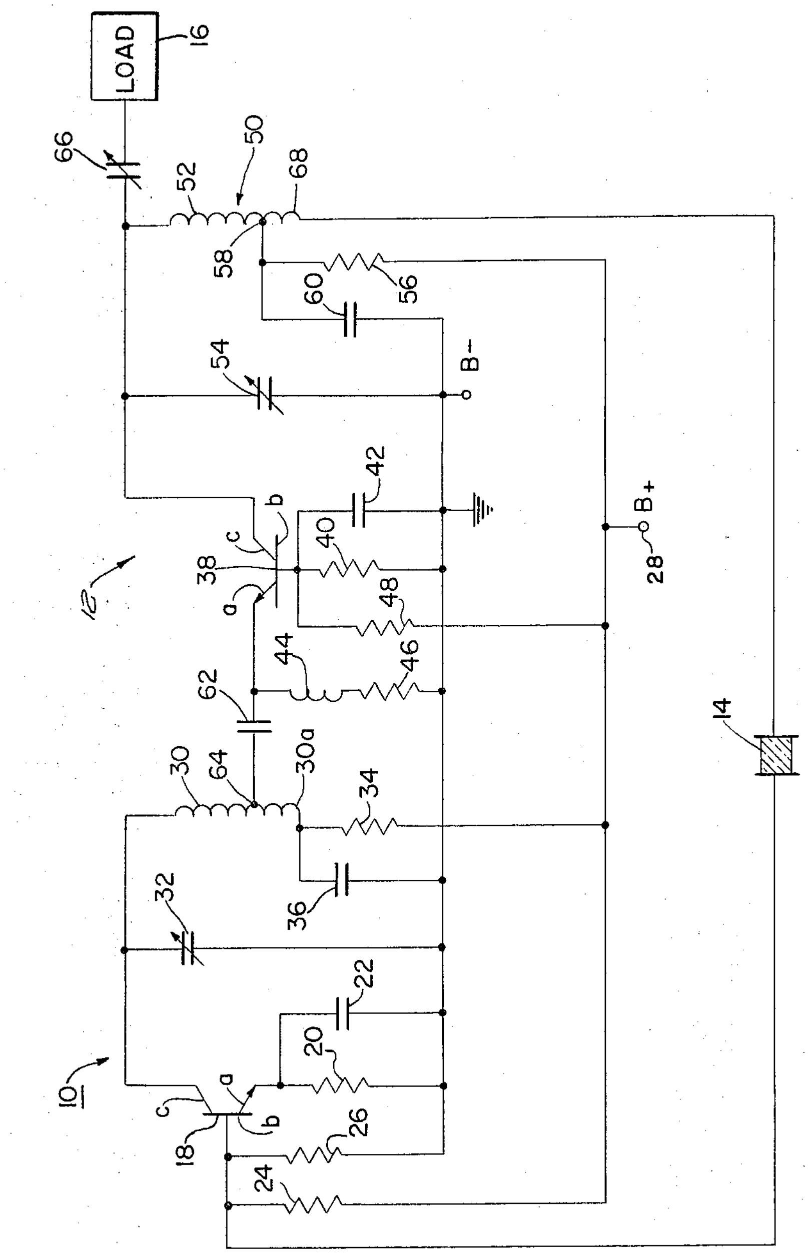
INVENTOR
JOSEPH E. RACY
BY United States Patent Office 3,286,198
Patented Nov. 15, 1966

3,286,198
FREQUENCY STABILIZED TRANSISTOR CRYSTAL OSCILLATOR

Joseph E. Racy, Nashua, N.H., assignor to Sanders Associates, Inc., Nashua, N.H., a corporation of Delaware
Filed Mar. 20, 1964, Ser. No. 353,389
8 Claims. (Cl. 331—116)

This invention relates to a radio frequency oscillator characterized by both a relatively large power output and a high degree of frequency stability. More particularly, it relates to a transistor oscillator including two stages of amplification within the regenerative loop, with the output stage connected in the common base configuration.

The problem with which the present invention is concerned is the generation of a relatively large amount of power by a transistorized, crystal-controlled oscillator, while retaining the inherent frequency stability of the crystal. With most circuits, high power and high stability are mutually incompatible requirements. This is probably due in part to the fact that the power is a function of the gain around the regenerative loop and therefore, with a given amplifying device, the power is increased by increasing the feedback. However, a high degree of positive feedback may adversely affect stability in either one of two ways. In the first place, it decreases stability of the loop gain in the face of variations in such factors as environmental temperature, supply voltages and aging of the amplifying device. Variations in the gain, in turn, are known to affect the frequency of oscillation even when a stable, high-Q frequency determining element such as a piezoelectric crystal is used. Moreover, since the crystal is incorporated in the feedback network, a high feedback ratio results in the application of increased power to the crystal, and this also adversely affects stability.

An oscillator largely overcoming this problem is the Franklin oscillator. In this device, a pair of amplification stages are cascaded, with both stages being within the regenerative loop. With the additional gain thus realized, a smaller feedback signal is required. Also this corresponds to a substantially lower feedback ratio for a given power output. Thus, two of the factors believed to contribute to frequency instability are markedly reduced.

The Franklin oscillator was originally a vacuum tube device. Prior to the present invention, it has not been used with the same degree of success with transistor amplification stages. With conventional transistor amplifiers, an amount of feedback sufficient to provide oscillation results in instability. A principal object of the present invention is to provide a transistor oscillator employing this technique and characterized by high stability.

Another object of the invention is to provide an oscillator of the above type characterized by a relatively high power output.

A further object of the invention is to provide an oscillator of the above type employing a piezoelectric crystal as a frequency determining element, with the stability of the oscillator approaching the ultimate stability obtainable with a crystal under the same environmental conditions.

Yet another object of the invention is to provide an oscillator of the above type capable of operation at high frequencies. More specifically, operation at 100 megacycles is an object of the invention.

A further object of the invention is to provide an oscillator of the above type which has a relatively simple construction.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawing, which is a schematic diagram of an oscillator incorporating the invention.

In general, an oscillator embodying the invention employs a plurality of cascaded transistor amplifying stages, with the output of the last stage fed back regeneratively to the input of the first stage as in a Franklin oscillator. However, in contrast to the usual practice, the output stage is connected in a common base configuration instead of the more conventional common emitter arrangement. This results in a marked increase in stability over a transistorized version of the Franklin oscillator using only common emitter stages.

With reference to the drawing, an oscillator embodying the invention has first and second stages generally indicated at 10 and 12, respectively. The output of the stage 12 is fed back to the input of stage 10 by way of a piezoelectric crystal 14, which determines the frequency of oscillation. The oscillator supplies energy to another circuit element shown schematically as a load 16.

The stage 10 includes a transistor 18 connected as a common emitter amplifier. Thus, the emitter 18 is connected to ground through an emitter resistor 20 bypassed by a capacitor 22. Bias is applied to the base **18*b* by means of a voltage divider comprising resistors 24 and 26 connected between a supply voltage terminal 28 and ground. The collector 18*c* is connected to one end of a tank circuit comprising an inductor 30 and tuning capacitor 32. The supply voltage for the collector is applied by means of a resistor 34 connected between the terminal 28 and the lower end 30*a* of the inductor 30. The end 30*a* is effectively grounded at a frequency of operation by means of a bypass capacitor 36** having negligible reactance at this frequency.

The stage 12 includes a transistor 38 connected as a common base amplifier. Thus, the base resistor 40 is connected between the base **38*b* and ground and bypassed by a capacitor 42. In series between the emitter 38*a* and ground are a choke 44 and resistor 46. This combination provides a relatively high impedance to ground at the frequency of operation, together with a relatively low resistance for the direct current in the emitter circuit. The biasing arrangement for the transistor 38 is completed by a resistor 48 connected between the terminal 28 and the base 38*b***.

The collector **38*c* is connected to a tank circuit comprising an autotransformer 50, whose primary 52 resonates with a tuning capacitor 54 at the frequency of operation. The collector voltage is applied by means of a resistor 56 connected between the terminal 28 and a tap 58 on the transformer 50. A bypass capacitor 60 is connected between the tap 58** and ground.

Coupling between the stages 10 and 12 is effected by means of a capacitor 62 connected between the emitter **38*a* and a tap 64 on the inductor 30. The tap 64 is positioned so as to provide a substantial impedance match between the output of the stage 10 and the input of the stage 12. A variable capacitor 66 serves to adjust coupling between the oscillator and the load 16**.

The crystal 14 is connected between the secondary 68 of the transformer 50 and the base **18*b* of the transistor 18. Again the tap 58 is positioned to provide a satisfactory impedance relationship between the output of the stage 12 and the input of the stage 10 by way of the crystal 14. Specifically, the turns ratio between the secondary 68 and primary 52** should be just great enough to ensure initiation of oscillation when the oscillator is turned on.

During oscillation the stage 10 operates in the class A range. The stage 12, on the other hand, operates as a class $AB_1$ amplifier. That is, there is rectification in the base-emitter circuit.

The oscillator exhibits a pronounced increase in stability as compared with comparable oscillators in which both stages are connected as common emitter amplifiers. The increased stability is particularly effective in the face of variations in temperature, supply voltage and load impedance. The advantages of the invention are particularly pronounced at frequencies above fifty megacycles. For example, an oscillator operating at 100 megacycles and delivering one-half watt to a load connected thereto had the stability of prior oscillators providing only fifty milliwatts.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

I claim:

1. A high frequency oscillator comprising
(A) first and second transistor amplifying stages,
(B) means coupling the output of said first stage to the input of said second stage,
(C) feedback means regeneratively feeding a portion of the output of said second stage to the input of said first stage to sustain oscillations in said oscillator,
(D) said second stage being connected in a common base configuration,
(E) said first stage being connected in a common emitter configuration.

2. The combination defined in claim 1 in which said oscillator includes means providing rectification in the base-emitter circuit of said second stage, whereby said second stage operates as a class $AB_1$ amplifier.

3. The combination defined in claim 2 in which said first stage is arranged for operation as a class A amplifier.

4. The combination defined in claim 1 in which said feedback means includes a piezoelectric crystal as a frequency-determining element for said oscillator.

5. The combination defined in claim 1

(A) including a tank circuit comprising the parallel combination of a capacitor and an inductor,
(B) said second stage developing an output voltage across said tank circuit,
(C) a winding inductively coupled to said inductor,
(D) a piezoelectric crystal,
(E) said crystal and said winding being in series with the base and emitter of said first stage.

6. A high frequency oscillator comprising
(A) first and second transistor amplyfying stages,
(B) means coupling the output of said first stage to the input of said second stage,
(C) feedback means regeneratively feeding a portion of the output of said second stage to the input of said first stage to sustain oscillations in said oscillator,
(D) said second stage being connected in a common base configuration,
(E) said first stage being connected in a common emitter configuration,
(F) means providing rectification in the base-emitter circuit of said second stage, whereby said second stage operates as a class $AB_1$ amplifier,
(G) a tank circuit comprising the parallel combination of a capacitor and an inductor, said second stage developing an output voltage across said tank circuit,
(H) a winding inductively coupled to said inductor,
(I) a piezoelectric crystal,
(J) said crystal and said winding being in series with the base and emitter of said first stage.

7. An oscillator comprising
(A) a plurality of cascaded transistor amplifying stages including an input stage and an output stage,
(B) feedback means regeneratively feeding a portion of the output of said output stage to said input stage so as to sustain oscillations in said oscillator,
(C) said output stage being connected in a common base configuration, and
(D) said oscillator being arranged for rectification in the base-emitter circuit of said output stage, thereby providing class $AB_1$ operation in said output stage.

8. The combination defined in claim 7, in which said input stage is arranged for operation as a class A amplifier.

References Cited by the Examiner

UNITED STATES PATENTS

| | | | |
|---|---|---|---|
| 3,066,252 | 11/1962 | Drake et al. | 331—116 X |
| 3,103,664 | 9/1963 | Hooper | 331—138 X |

ROY LAKE, *Primary Examiner.*

S. H. GRIMM, *Assistant Examiner.*